United States Patent
Suh

(10) Patent No.: US 10,612,840 B2
(45) Date of Patent: Apr. 7, 2020

(54) APPARATUS FOR CONTROLLING REFRIGERATOR, REFRIGERATOR AND METHOD FOR DIAGNOSING FAULT OF REFRIGERATOR

(71) Applicant: LG ELECTRONICS INC., Seoul (KR)

(72) Inventor: Yonghun Suh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 165 days.

(21) Appl. No.: 15/419,104

(22) Filed: Jan. 30, 2017

(65) Prior Publication Data
US 2017/0219280 A1    Aug. 3, 2017

(30) Foreign Application Priority Data
Feb. 1, 2016    (KR) .................. 10-2016-0012426

(51) Int. Cl.
| F25D 29/00 | (2006.01) |
| G01R 21/00 | (2006.01) |
| G01R 31/02 | (2006.01) |
| G05F 3/02 | (2006.01) |
| F25D 11/02 | (2006.01) |

(52) U.S. Cl.
CPC ........... *F25D 29/006* (2013.01); *G01R 21/00* (2013.01); *G01R 31/02* (2013.01); *G05F 3/02* (2013.01); *F25B 2500/19* (2013.01); *F25B 2700/15* (2013.01); *F25D 11/02* (2013.01); *F25D 29/00* (2013.01)

(58) Field of Classification Search
CPC ........ F25D 29/006; F25D 11/02; F25D 29/00; G01R 21/00; G01R 31/02; G05F 3/02; F25B 2500/19; F25B 2700/15
See application file for complete search history.

(56) References Cited

U.S. PATENT DOCUMENTS

| 2006/0123807 A1 * | 6/2006 | Sullivan ................. G01D 4/004 62/129 |
| 2013/0173186 A1 * | 7/2013 | Lim ....................... G01R 31/00 702/58 |
| 2013/0340457 A1 * | 12/2013 | Keres ................... F25B 49/005 62/129 |

(Continued)

FOREIGN PATENT DOCUMENTS

KR    10-2013-0080103    7/2013

OTHER PUBLICATIONS

Korean Office Action dated Jun. 20, 2017 issued in Application No. 10-2016-0012426.

*Primary Examiner* — Rexford N Barnie
*Assistant Examiner* — Elim Ortiz
(74) *Attorney, Agent, or Firm* — Ked & Associates, LLP

(57) ABSTRACT

An apparatus for controlling a refrigerator, and a method for diagnosing a fault of the refrigerator are presented. More specifically, a power consumption of a refrigerator may be measured, and a fault of a plurality of loads included in the refrigerator may be diagnosed based on the measured power consumption. Accordingly, all of the plurality of loads included in the refrigerator may be diagnosed whether they have a fault or not. Further, among the plurality of loads included in the refrigerator, one or more loads having feedback uncontrollable may be diagnosed whether they have a fault of not.

11 Claims, 10 Drawing Sheets

(56) References Cited

U.S. PATENT DOCUMENTS

2014/0253102 A1* 9/2014 Wood ............... G01R 1/203
324/140 R
2017/0023934 A1* 1/2017 Dempsey ........... G05B 23/0235

* cited by examiner

FIG. 6

| ENERGY CONSUMPTION LOAD | | POWER CONSUMPTION |
|---|---|---|
| DEFROSTING HEATER | | A1 |
| HOME BAR HEATER | | A2 |
| CIRCUITRY | | A3 |
| MECHANICAL CHAMBER FAN MOTOR | High | A4 |
| | Middle | A5 |
| | Low | A6 |
| FREEZING CHAMBER FAN MOTOR | High | A7 |
| | Middle | A8 |
| | Low | A9 |
| ⋮ | ⋮ | ⋮ |
| ETC. | ... | ... |

| ENERGY CONSUMPTION LOAD | POWER CONSUMPTION [W] |
|---|---|
| A | 20 |
| B | 30 |
| C | 40 |
| D | 50 |
| E | 60 |

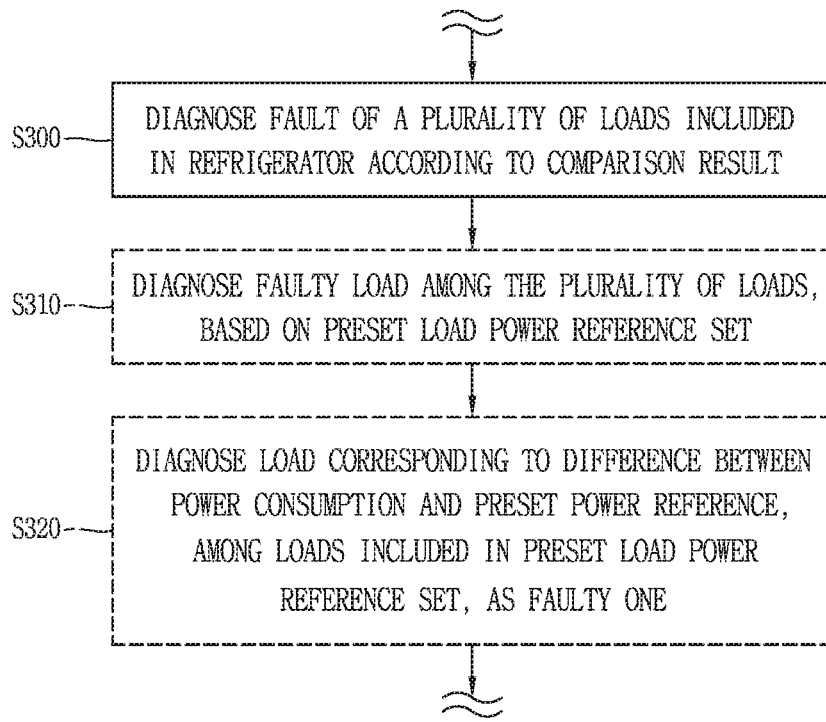
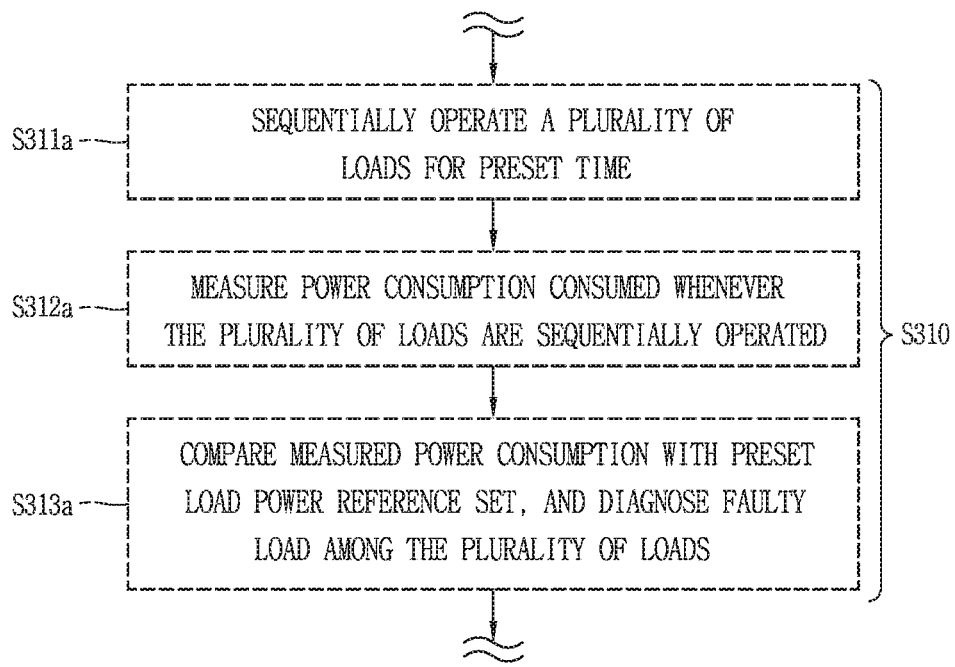

APPARATUS FOR CONTROLLING REFRIGERATOR, REFRIGERATOR AND METHOD FOR DIAGNOSING FAULT OF REFRIGERATOR

CROSS-REFERENCE TO RELATED APPLICATION(S)

Pursuant to 35 U.S.C. § 119(a), this application claims the benefit of an earlier filing date of and the right of priority to Korean Application No. 10-2016-0012426, filed on Feb. 1, 2016, the contents of which are incorporated by reference herein in its entirety.

BACKGROUND

1. Field

This specification relates to an apparatus for controlling a refrigerator, a refrigerator, and a method for diagnosing a fault of a refrigerator.

2. Background

The background of the present application relates to a refrigerator and a method for diagnosing a fault of a refrigerator. A refrigerator is an apparatus for storing food items therein in a frozen or cooled state. The refrigerator is provided with a refrigerator body having therein a food storage chamber, and a refrigeration cycle apparatus for cooling. The refrigeration cycle apparatus generally includes a compressor, a condenser, an expansion device and an evaporator. Generally, a mechanical chamber is formed at a rear region of the refrigerator body, and the compressor and the condenser included in the refrigeration cycle apparatus are installed in the mechanical chamber.

The refrigerator includes various loads (i.e., components consuming electrical power), as well as the above components. As such, various loads are operated, and various functions are executed for driving the refrigerator. The loads of the refrigerator may be operated by power received from an outside power source, and may be controlled by a controller (microcomputer) of the refrigerator. The loads of the refrigerator and components to drive the refrigerator should be maintained and repaired for driving of the refrigerator. That is, it is important to check whether the loads of the refrigerator have a fault or not, for driving and maintenance of the refrigerator.

The conventional techniques to diagnose a fault of loads of a refrigerator are as follows. According to a first technique, a fault diagnosis is executed by a controlling unit which controls loads of a refrigerator, i.e., a central controller (microcomputer) which controls loads of a refrigerator, or an exclusive controlling unit with respect to a corresponding load (e.g., a fan motor driving unit which controls a fan motor, a compressor driving unit which controls a compressor, etc.). According to a second technique, an additional component or configuration for manually initiating a fault diagnosis (e.g., a fault diagnosing button) may be provided. In a case where a user manipulates a refrigerator for fault diagnosis function, a fault diagnosis is executed.

However, the conventional techniques may have the following problems. Firstly, there is a limitation in loads which execute a fault diagnosis. In case of the controller-based technique (a), a load controlling unit is used to diagnose a fault of a load based on a feedback signal with respect to the load. This may cause a load having uncontrollable feedback to not be diagnosed. Even in case of using an exclusive (i.e., dedicated) controlling unit, only loads controllable by the exclusive controlling unit may be diagnosed, and loads not requiring such an exclusive controlling unit or having uncontrollable feedback (e.g., a relay device, a valve, etc.) may not be diagnosed. In case of the second technique that uses an additional configuration for fault diagnosis, only loads having their feedback signals for fault diagnosis sensed are diagnosed, and loads not having their feedback signals for fault diagnosis or feedback signals that are not sensed are not diagnosed.

Secondly, there is a limitation in diagnosing a fault by using a feedback signal with respect to a fault diagnosis. That is, a fault diagnosis is executed under an additional configuration for fault diagnosis or a programming for fault diagnosis. This may cause only loads having controllable feedback to be diagnosable, and may cause a difficulty in designing a refrigerator due to an additional configuration for fault diagnosis (a circuitry configuration or a program configuration).

Thirdly, there is a limitation in diagnosing a fault due to a user's manual operation. In case of a technique for manually initiating fault detection, a fault diagnosis is executed only when a user presses a specific button or performs a manipulation for fault diagnosis function. This may degrade user's convenience and may lower efficiency in maintaining, repairing, and checking a refrigerator. As a result, a lifespan of the refrigerator may be shortened, and a driving efficiency of the refrigerator may be lowered.

Overall, the conventional techniques to diagnose a fault of a refrigerator potentially shorten a lifespan of a refrigerator and lower safety and usability of the refrigerator because there is a limitation in loads which can execute a fault diagnosis (e.g., only loads having controllable feedback are used), a design is complicated due to an additional configuration for error detection, a user's manual operation is used, maintenance and repair is difficult, etc.

BRIEF DESCRIPTION OF THE DRAWINGS

The embodiments will be described in detail with reference to the following drawings in which like reference numerals refer to like elements wherein:

FIG. 6 is an exemplary illustrating an example of a preset load power reference set according to an embodiment of an apparatus for controlling a refrigerator and a refrigerator according to the present application;

FIG. 10 is a flowchart illustrating processes according to an embodiment of a method for diagnosing a fault of a refrigerator according to the present application;

FIG. 11A is a first flowchart illustrating processes of diagnosing a faulty load according to an embodiment of a method for diagnosing a fault of a refrigerator according to the present application;

DETAILED DESCRIPTION

Description will now be given in detail of preferred configurations of an apparatus for controlling a refrigerator, a refrigerator, and a method for diagnosing a fault of a refrigerator according to the present application, with reference to the accompanying drawings. However, the present application is not limited to this. That is, the present application may be applicable to all of the existing apparatuses for controlling a refrigerator, refrigerators, and methods for diagnosing a fault of a refrigerator to which the technical scope of the present application may be applicable.

Figure 1:
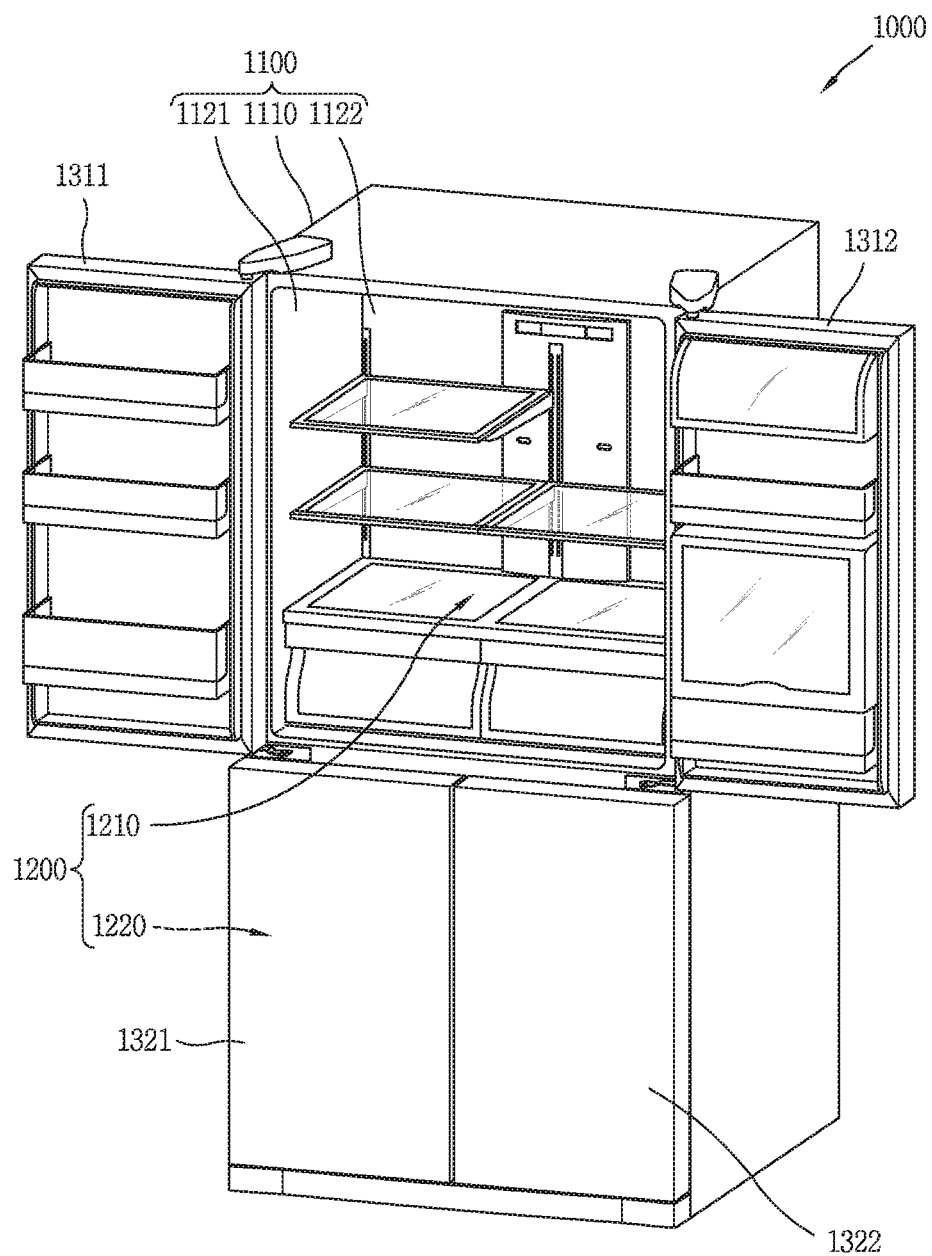
FIG. 1 is a structural view illustrating an example of a refrigerator to which an apparatus for controlling a refrigerator, a refrigerator, and a method for diagnosing a fault of a refrigerator according to the present application are applied.

With reference to FIG. 1, will be explained a structure of an exemplary refrigerator to which an apparatus for controlling a refrigerator, a refrigerator, and a method for diagnosing a fault of a refrigerator according to the present application may be applicable.

FIG. 1 is a structural view illustrating an example of a refrigerator to which an apparatus for controlling a refrigerator, a refrigerator, and a method for diagnosing a fault of a refrigerator according to the present application are applied. As shown in FIG. 1, the exterior appearance of a refrigerator 1000 is defined by a refrigerator body 1100 and doors 1311, 1312, 1321, 1322. The refrigerator body 1100 includes an outer case 1110 and inner cases 1121, 1122.

The outer case 1110 forms the remaining appearance of the refrigerator 1000, except for a front surface of the refrigerator 1000 formed by the doors 1311, 1312, 1321, 1322. An upper surface or a side surface of the refrigerator 1000 shown in FIG. 1 corresponds to the outer case 1110. The inner cases 1121, 1122 are installed inside the outer case 1110. The inner cases 1121, 1122 form a food storage chamber 1200 inside the refrigerator body 1100. The food storage chamber 1200 may be divided into a refrigerating chamber 1210 and a freezing chamber 1220 according to a set temperature.

FIG. 1 illustrates the bottom freezer type of refrigerator 1000 where the refrigerating chamber 1210 is disposed at an upper part of the refrigerator body 1100 and the freezing chamber 1220 is disposed at a lower part of the refrigerator body 1100. However, the present application is not limited to this. That is, the present application may be applied to a side by side type of refrigerator where a refrigerating chamber and a freezing chamber are disposed side by side, a top mount type of refrigerator where a freezing chamber is disposed above a refrigerating chamber, etc.

The doors 1311, 1312, 1321, 1322 are connected to the refrigerator body 1100, and forms appearance of the front surface of the refrigerator 1000. The doors 1311, 1312, 1321, 1322 may be divided into rotatable doors and drawer type doors according to an opening/closing manner. The rotatable doors are rotatably installed at the refrigerator body 1100, and the drawer type doors are slidably connected to the refrigerator body 1100.

The doors 1311, 1312, 1321, 1322 may be sorted according to an installation position. That is, the doors may be sorted into the refrigerating chamber doors 1311, 1312 for opening and closing the refrigerating chamber 1210, and the freezing chamber doors 1321, 1322 for opening and closing the freezing chamber 1220. Further, the doors may be sorted into the left refrigerating chamber door 1311 and the right refrigerating chamber door 1312, and the left freezing chamber door 1321 and the right freezing chamber door 1322, according to whether an installation position is a left side or a right side.

The configuration of the aforementioned refrigerator 1000 is an example to explain a basic structure of a refrigerator. The refrigerator, to which an apparatus for controlling a refrigerator, a refrigerator, and a method for diagnosing a fault of a refrigerator according to the present application may be applicable, may have another structure rather than the aforementioned structure.

With reference to FIGS. 2 to 7, an apparatus for controlling a refrigerator according to the present application will be explained. The apparatus for controlling a refrigerator according to the present application (hereinafter, will be referred to as 'controlling apparatus') may be a controlling apparatus for the aforementioned refrigerator. For instance, the controlling apparatus may be a microcomputer, a controlling apparatus for the aforementioned refrigerator. The controlling apparatus may include a plurality of circuit devices and may be formed as a single module. The controlling apparatus may be included in the refrigerator and configured to control an operation of the refrigerator. The controlling apparatus may be included in the refrigerator, configured to control a plurality of loads included in the refrigerator, and thus, configured to control an operation of the refrigerator. The controlling apparatus may be a controlling apparatus separated from a micro-processor for the refrigerator, and configured to control an operation and a function of one or more loads included in the refrigerator. The controlling apparatus may be configured to control a plurality of loads included in the refrigerator and to diagnose a fault in one or more the plurality of loads. The controlling apparatus may be configured to control a plurality of loads included in the refrigerator and to real-time diagnose a fault in one or more of the plurality of loads.

Figure 2:
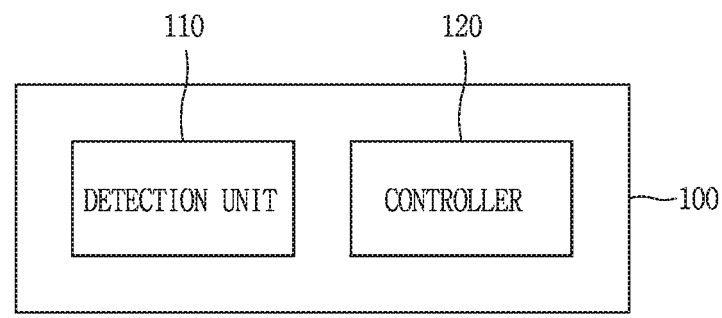
FIG. 2 is a view illustrating a configuration of an apparatus for controlling a refrigerator according to the present application.

For convenience, an embodiment of the controlling apparatus will be hereinafter explained with an assumption that the controlling apparatus is a microcomputer for the refrigerator. As shown in FIG. 2, the controlling apparatus (or error detector) 100 may include a detection unit (or detector) 110 configured to detect a current inputted to the refrigerator, and a controller (or processor) 120 configured to measure a power consumption of the refrigerator based on a detection result by the detection unit 110, to compare the measured power consumption with a preset (or prescribed) power reference, and to diagnose a fault of a plurality of loads included in the refrigerator according to a result of the comparison.

The preset power reference may set by a manufacturer. In one example, the preset power reference may vary based on the configuration of the regenerator 1000, such as temperature settings for the refrigerating chamber 1210 and the freezing chamber, whether an ice maker is activated, etc. In another example, the preset power reference may vary based on environmental conditions, such as ambient temperature and air moisture levels. Additionally or alternatively, the preset power reference may be dynamically determined by the controller 120. For example, the controller 120 may measure power usage by the loads 10 during one or more prior time periods and may calculate the present power reference based on the measured prior power usage. For example, the present power reference may correspond to an average power usage, a peak power usage, a minimum power usage, a mode of the power usages, a median of the power usages, etc.

Figure 3:
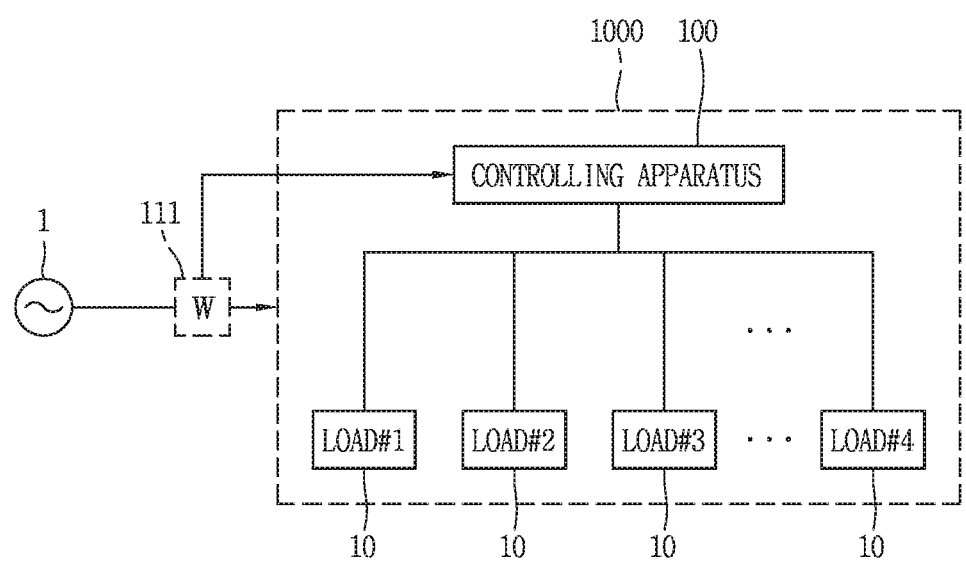
FIG. 3 is a first exemplary view according to an embodiment of an apparatus for controlling a refrigerator and a refrigerator according to the present application.

As shown in FIG. 3, the controlling apparatus 100 may be included in or otherwise be coupled to the refrigerator 1000 having a plurality of loads 10. The controlling apparatus 100 may be configured to detect, by the detection unit 110, a current inputted to the refrigerator 1000. The controller 120 in the controlling apparatus 100 may be configured to measure power consumption of the refrigerator 1000 based on a detection result by the detection unit 110, configured to compare the measured power consumption with a preset power reference, and configured to diagnose a fault occurring in one or more of the plurality of loads 10 included in the refrigerator 1000 according to a result of the comparison. The refrigerator 1000 may be provided with a power from an external power source 1, and the refrigerator 1000 may receive a current to drive the refrigerator 1000 from the external power source 1.

The plurality of loads 10 included in the refrigerator 1000 may be controlled by the controlling apparatus 100. The plurality of loads 10 included in the refrigerator 1000 may include one or more loads having feedback that is uncontrollable by the controlling apparatus 100. That is, the plurality of loads 10 may include certain loads 10 having feedback that is controllable by the controlling apparatus 100, and may include at least one other load 10 having feedback that is not uncontrollable by the controlling apparatus 100.

Figure 4:
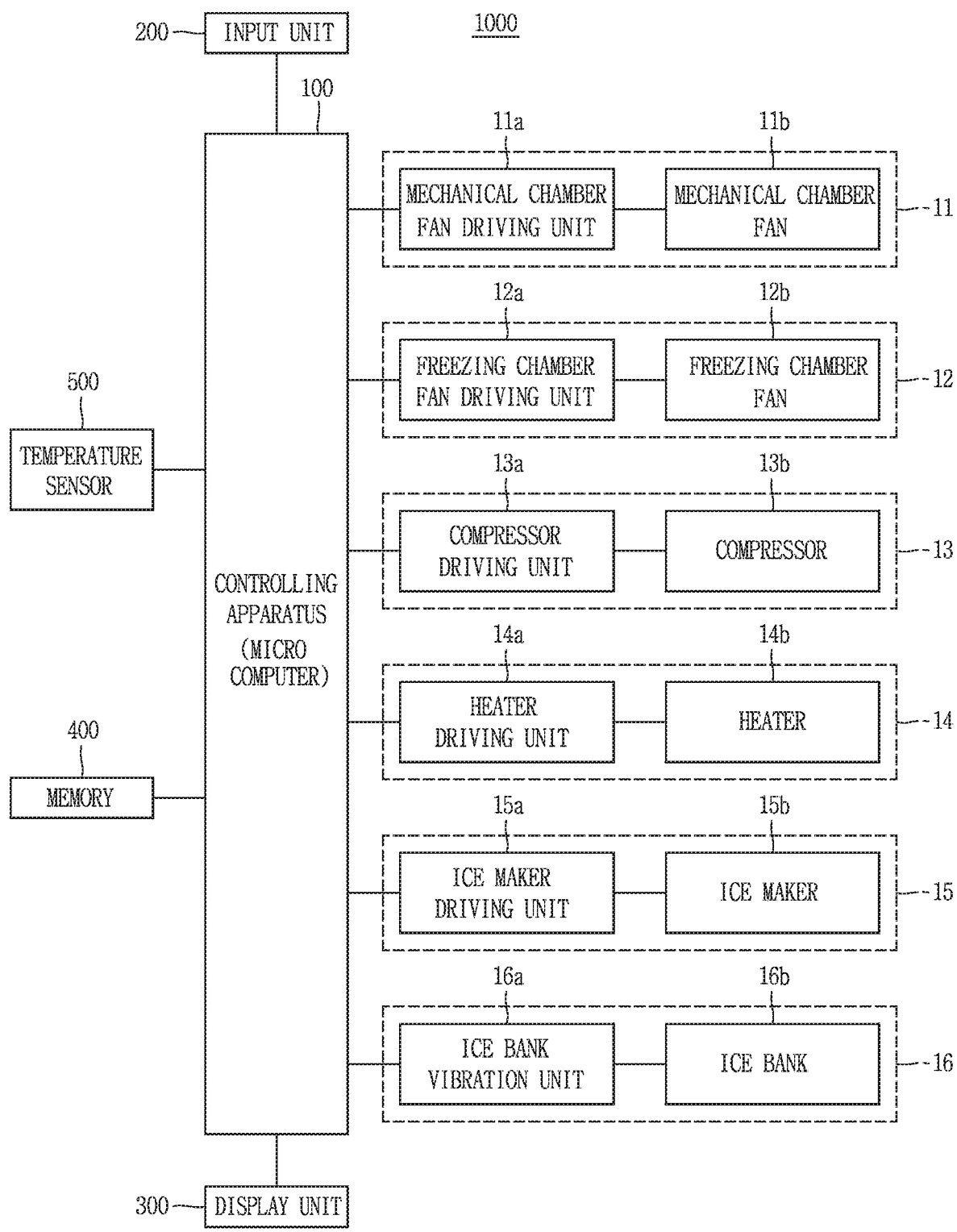
FIG. 4 is a secondary exemplary view according to an embodiment of an apparatus for controlling a refrigerator and a refrigerator according to the present application.

As shown in FIG. 4, the refrigerator 1000 may include a plurality of loads 10 (shown in FIG. 4 as different components 11-16) and the controlling apparatus 100 (also referred to as a microcomputer). The refrigerator 1000 may further include one or more of an input unit 200 configured to receive a command from the outside, a display unit 300 configured to display state information, etc. of the refrigerator 1000 to the outside, a memory 400 configured to store therein information about the refrigerator 1000, and a temperature sensor 500 configured to sense a temperature of the refrigerator 1000. The input unit 200, the display unit 300, the memory 400, and the temperature sensor 500 are controlled by the controlling apparatus 100, thereby executing functions of the refrigerator 1000. The input unit 200, the display unit 300, the memory 400 and the temperature sensor 500 shown in FIG. 4 are merely presented as components for explaining an embodiment of the refrigerator 1000, and are not necessary components of the refrigerator 1000. Thus, the refrigerator 1000 may exclude the above components and/or may further include other components that different from than these components.

As shown in FIG. 4, the plurality of loads 10 of the refrigerator 1000 may include at least one of a mechanical chamber load 11 having a mechanical chamber fan 11*b* and a mechanical chamber fan driving unit 11*a*; a freezing chamber load 12 including a freezing chamber fan 12*b* and a freezing chamber fan driving unit 12*a*; a compressor load 13 including a compressor 13*b* and a compressor driving unit 13*a*; a heater load 14 including a heater 14*b* and a heater driving unit 14*a*, an ice maker load 15 including an ice maker 15*b* and an ice maker driving unit 15*a*, and an ice bank load 16 including an ice bank 16*b* and an ice bank vibration unit 16*a*. The particular configuration (i.e., including the plurality of components 11-16) depicted in FIG. 4 are provided merely for explaining an example embodiment of the refrigerator 1000, and are not necessary components of the refrigerator 1000. Thus, the refrigerator 1000 may exclude the above components and/or may further include other components rather than the above components.

The detection unit 110 is configured to detect and measure a current inputted to the refrigerator 1000. Here, the current inputted to the refrigerator 1000 may be a current inputted in a state where the refrigerator 1000 is being driven, that is, in a state when the refrigerator 1000 is active and consuming electrical energy. The detection unit 110 may real-time detect a current inputted to the refrigerator 1000. That is, the detection unit 110 may real-time detect a current inputted to the refrigerator 1000 being driven.

The detection unit 110 may detect a current of a power input unit which applies a power to the refrigerator 1000. The detection unit 110 may detect a current inputted to the refrigerator 1000 by a current detection unit 111 provided at the power input unit. The current detection unit 111 may be a current transformer (CT), or a current sensor. The detection unit 110 may detect a current inputted to the refrigerator 1000, based on a sensing result received from the current detection unit 111.

The detection unit 110 may detect a current inputted to the refrigerator 1000, and may transmit a detection result to the controller 120. The detection unit 110 may detect a current inputted to the refrigerator 1000, may generate a signal based on a detection result, and may transmit the generated signal to the controller 120.

The controller 120 may measure a power consumption of the refrigerator 1000 based on a detection result by the detection unit 110, and may compare the measured power consumption with the preset power reference. Then, the controller 120 may diagnose a fault of the plurality of loads 10 included in the refrigerator 1000 according to a result of the comparison.

Figure 5:
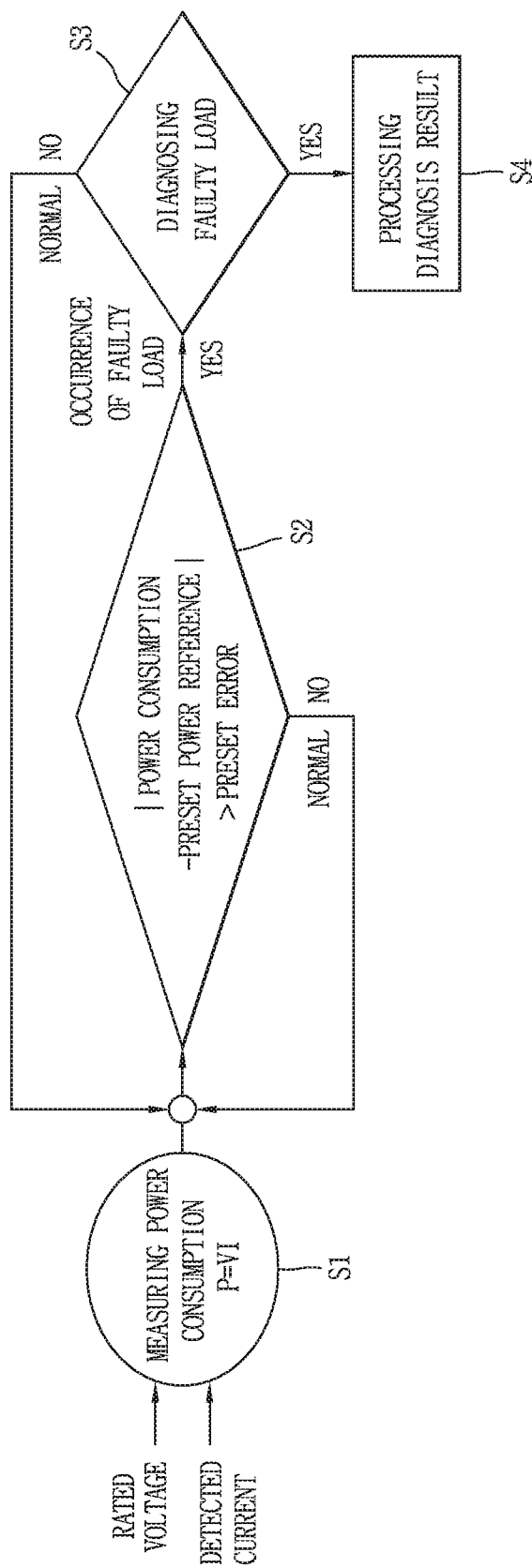
FIG. 5 is a block diagram illustrating a method for diagnosing a fault of a refrigerator according to an embodiment of an apparatus for controlling a refrigerator and a refrigerator according to the present application.

The controller 120 may diagnose a fault of the plurality of loads 10 through processes shown in FIG. 5. The controller 120 may receive the detection result from the detection unit 110 and may measure a power consumption of the refrigerator 1000 based on the detection result (S1). As described in detail below, the controller 120 may measure the power consumption based on the detection result identifying a current being supplied to the refrigerator 1000 and a rated voltage of the refrigerator 1000.

The rated voltage of the refrigerator 1000 may be a prevailing voltage applied to the refrigerator 1000, which may be 220V or 110V for instance. Preferably, the rated voltage of the refrigerator 1000 may be 220V. The controller 120 may then measure the power consumption by multiplying the detection result identifying a current inputted to the refrigerator 1000 by the rated voltage of the refrigerator 1000.

The controller 120 may measure the power consumption by the following power calculation equation 1.

$$P = V \times I \qquad (\text{Eq.1}),$$

where P is power [watts—W], V is the rated potential or voltage [volts—V], and I is the detected current [amperes—A]. In an example where the detection result (current) is 4

A and the rated voltage of the refrigerator 1000 is 220V, the controller 120 may measure an electric power as 880 W (i.e., 4 A×220V=880 W) according to equation 1.

Then, the controller 120 may compare the measured power consumption with the preset power reference and may diagnose a fault of the plurality of loads 10 included in the refrigerator 1000 based on the comparison (S2). The preset power reference may be a reference power consumption associated with the refrigerator 1000 when properly functioning. For example, the preset power reference may be a sum of rated power consumptions consumed by the plurality of loads 10 while the refrigerator 1000 is performing a full-load operation. The preset power reference may be a reference with respect to an entire rated power consumption consumed by the refrigerator 1000 or the plurality of loads 10 while the refrigerator 1000 is performing a full-load operation. That is, the controller 120 may measure a power consumption real-time consumed by the refrigerator 1000, and may compare the power consumption with the preset power reference, corresponding to an entire rated power consumption of the refrigerator 1000. If the power consumption is different from the preset power reference as a result of the comparison (or differs by more than a threshold amount), the controller 120 determines that a fault has occurred in at least one of the plurality of loads 10 included in the refrigerator 1000. Accordingly, the controller 120 may diagnose whether the plurality of loads 10 are operating normally or abnormally.

If a difference between the power consumption and the preset power reference is within the preset error range (i.e., the measured power consumption differs by less than a threshold amount from the reference power levels), the controller 120 may determine that the plurality of loads 10 are operating normally. The preset error range may be an allowable error range of the preset power reference. If a difference between the power consumption and the preset power reference is within a preset error range, the controller 120 may determine that the plurality of loads 10 are operating normally since the energy consumption of the plurality of loads 10 corresponds to expected levels associated with normal execution of the loads 10. For instance, in a case where the preset power reference is 500 W, the preset error range is ±10 W, and the measured power consumption is between 490 W and 510 W, the controller 120 determines that a difference between the power consumption and the preset power reference is within the preset error range of ±10 W.

When the measured power consumption differs from the references levels by less than the error range, the controller 120 may determine that energy consumption of the plurality of loads 10 correspond to normal execution, and thus determine that each of the plurality of loads 10 is operating normally. Thus, if a difference between the power consumption and the preset power reference is within the preset error range, the controller 120 may diagnose that the plurality of loads 10 are normally operating and have no fault. If it is diagnosed that the plurality of loads 10 have no fault, the controller 120 may control the refrigerator 1000 to maintain its driving state. If it is diagnosed that the plurality of loads 10 have no fault, the controller 120 may control the plurality of loads 10 such that a driving state of the refrigerator 1000 may be maintained.

Conversely, if a difference between the measured power consumption and the preset power reference is greater than the preset error range, the controller 120 may determine that at least one of the plurality of loads 10 has a fault. In particular, if a difference between the power consumption and the preset power reference is out of the preset error range, the controller 120 may determine that energy consumption of at least one of the plurality of loads 10 is abnormal, and thus, the at least one of the plurality of loads 10 has a fault.

For instance, in a case where the preset power reference is 500 W, the preset error range is ±10 W, and the power consumption is less than 489 W or more than 511 W, a difference between the power consumption and the preset power reference is out of the preset error range. Accordingly, the controller 120 may determine that energy consumption of at least one of the plurality of loads 10 is abnormally executed, and thus the at least one of the plurality of loads 10 has a fault.

If a difference between the power consumption and the preset power reference is out of the preset error range, the controller 120 may determine that at least one of the plurality of loads 10 has a fault, and may diagnose at least one faulty load among the plurality of loads 10 (S3). If it is determined that at least one of the plurality of loads 10 has a fault as a result of comparing the measured power consumption with the preset power reference, the controller 120 may diagnose a faulty load 10 among the plurality of loads 10, based on a preset load power reference set (S4).

The preset load power reference set may be a reference with respect to a rated power consumption of each of the plurality of loads 10. That is, the preset power reference may be a sum of rated power consumptions of the plurality of loads 10 included in the preset load power reference set.

The preset load power reference set may be set as rated power consumptions of the plurality of loads 10 are implemented in the form of a table. For instance, the preset load power reference set may be shown in FIG. 6. For instance, as shown in FIG. 6, the preset load power reference set may be formed as rated power consumptions of the plurality of loads 10 included in the refrigerator 1000 (i.e., a defrosting heater (power consumption A1), a home bar heater (power consumption A2), a circuit (power consumption A3), mechanical chamber fan motors (power consumptions A4-A6) and freezing chamber fan motors (power consumptions A7-A9) are implemented in the form of a table. For example, the mechanical chamber fan motors are expected to have one of the power consumptions A4-A6 when operating in a corresponding one of low, medium, or high modes. Similarly, the freezing chamber fan motors are expected to have one of the power consumptions A7-A9 when operating in a corresponding one of low, medium, or high modes.

In the preset load power reference set shown in FIG. 6, the preset power reference may be a sum of power consumptions A1-A3, one of A4-A5, and one of A7-A9, which are the rated power consumptions of the plurality of example loads 10 included in the refrigerator 1000. The table shown in FIG. 6 is a mere example to explain the preset load power reference set disclosed in the present application, and the preset load power reference set may be implemented in another process rather than the process shown in FIG. 5. If it is determined that one or more loads among the plurality of loads 10 malfunction, the controller 180 may diagnose one or more faulty loads among the plurality of loads 10, based on the power consumption and the preset load power reference set.

Hereinafter, an embodiment to diagnose a fault of one or more loads by the controller 120 will be explained based on the preset load power reference set shown in FIG. 7. In a first example of diagnosing an occurrence of a fault in refrigerator 1000, the controller 120 compares the power consumption with the preset power reference, and determines that one or more of the plurality of loads 10 operate abnormally when a difference between the power consumption and the preset power reference is out of the preset error range. Then, the controller 120 diagnoses a faulty load among the plurality of loads 10, based on the preset load power reference set. In this case, the controller 120 may diagnose a load corresponding to the difference between the power consumption and the preset power reference, among loads included in the preset load power reference set, as a faulty one.

Figures 7, 8:
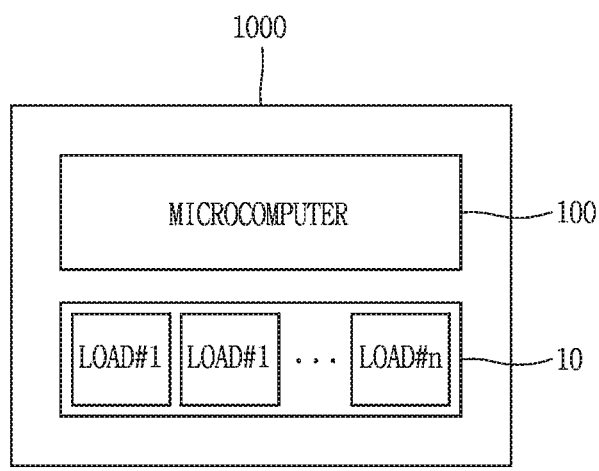
FIG. 7 is an exemplary illustrating an example of a preset load power reference set, which is for explaining an embodiment of an apparatus for controlling a refrigerator and a refrigerator according to the present application.
FIG. 8 is a view illustrating a configuration of a refrigerator according to the present application.

Referring to FIG. 7, in a case where the measured power consumption is 180 W and the preset power reference is 200 W (20 W+30 W+40 W+50 W+60 W), such that a difference between the power consumption and the preset power reference is 20 W. In this case, the controller 120 may determine a load corresponding to the difference (20 W) among loads included in the preset load power reference set, and may diagnose that load 'A' has a fault. That is, if a fault occurs on load 'A', which is expected to consume a rated power of 20 W, the load 'A' does not normally operate. Thus, the refrigerator 1000 has a power consumption of 180 W without consuming 20 W corresponding to a rated power consumption of the load 'A', among the preset power reference 200 W. As the power consumption of the controller 120 is measured as 180 W, it may be diagnosed that a fault has occurred on the load 'A' corresponding to the difference (20 W) between the measured power consumption and the preset power reference.

As another example, in a case where the power consumption is 170 W and the preset power reference is 200 W, a difference between the power consumption and the preset power reference is 30 W. In this case, the controller 120 may determine a load corresponding to the difference (30 W), among loads included in the preset load power reference set, and may diagnose that load '13' has a fault.

In a second example of diagnosing an occurrence of a fault, the controller 120 compares the measured power consumption with the preset power reference, and determines that one or more of the plurality of loads 10 operate abnormally when a difference between the power consumption and the preset power reference is out of the preset error range. Then, the controller 120 diagnoses a faulty load among the plurality of loads 10, based on the preset load power reference set. In this case, the controller 120 may stop the plurality of loads 10, and then sequentially operate the plurality of loads 10 for a preset time. The controller 120 may measure a different power consumption consumed as the plurality of loads 10 are sequentially operated. Then, the controller 120 may compare the measured power consumption with the preset load power reference set, and may diagnose a faulty load among the plurality of loads 10 according to a result of the comparison.

Here, the preset time may be a time for the controller 120 to diagnose a faulty load among the plurality of loads 10. That is, the preset time may mean a time for the controller 120 to perform a trouble shooting with respect to the plurality of loads 10. The preset time may be set as a time to diagnose a fault of the plurality of loads 10, without influencing on a normal operation of the refrigerator 1000. For example, the preset time may be preferably set as one minute.

The controller 120 may stop the plurality of loads 10, and then may measure a power consumption consumed whenever the plurality of loads 10 are sequentially operated. Then, the controller 120 may compare the measured power consumption with the preset load power reference set and may diagnose a load corresponding to a power consumption not matching powers included in the preset load power reference set, as a faulty one.

This will be explained in more detail with reference to FIG. 7. Firstly, the plurality of loads 10 (A, B, C, D, E) are stopped, and then the plurality of loads 10 (A, B, C, D, E) are sequentially operated. In this case, measured are a power consumption consumed when load 'A' is operated (first power consumption: load 'A'), a power consumption consumed when load 'B' is operated after the load 'A' is operated (second power consumption: load 'A'+load 'B'), a power consumption consumed when load 'C' is operated after the load 'B' is operated (third power consumption: load 'A'+load 'B'+load 'C'), a power consumption consumed when load 'D' is operated after the load 'C' is operated (fourth power consumption: load 'A'+load 'B'+load 'C'+load D'), and a power consumption consumed when load 'E' is operated after the load 'D' is operated (fifth power consumption: load 'A'+load 'B'+load 'C'+load 'D'+load 'E'). Then, the controller 120 compares each of the first to fifth power consumptions with the preset load power reference set. In this case, the controller may diagnose a load which has been operated when a power consumption not matching powers included in the preset load power reference set, among the first to fifth power consumptions, is measured, as a faulty one.

For instance, in a case where the first power consumption is 20 W, the second power consumption is 50 W, the third power consumption is 90 W, the fourth power consumption is 90 W and the fifth power consumption is 150 W, the first to third power consumptions match power consumptions consumed when the respective loads are operated as expected. On the contrary, the fourth measured power consumption (90 W) does not match an expected power (140 W) that should consumed when the functioning loads 'A'-'D' are operated. Thus, the controller may diagnose that the load 'D' which has been activated when the fourth power consumption is measured, as a faulty load.

Preferably, the controller 120 which diagnoses a fault may measure a power consumption consumed whenever the plurality of loads 10 are sequentially operated, and may compare the measured power consumption with the preset load power reference set, thereby diagnosing a faulty load among the plurality of loads 10. For instance, when each of the first to fifth power consumptions is measured, i.e., whenever the plurality of loads 10 are sequentially operated, the controller 120 may compare the measured power consumption with the preset load power reference set to thus diagnose a faulty load. Through the above processes, the controller 120 may sequentially diagnose the plurality of loads 10 to determine whether they have a fault or not, and may sequentially execute a trouble shooting with respect to the plurality of loads 10, thereby diagnosing a fault of the refrigerator 1000.

In a third example of diagnosing an occurrence of a fault, the controller 120 compares the power consumption with the preset power reference, and determines that one or more of the plurality of loads 10 operate abnormally when a difference between the power consumption and the preset power reference is out of the preset error range. The controller 120 diagnoses a faulty load among the plurality of loads 10, based on the preset load power reference set. In this case, the controller 120 may stop the plurality of loads 10, and then alternately operate the plurality of loads 10 for a preset time. The controller 120 may measure a power consumption consumed whenever the plurality of loads 10 are alternately operated. Then, the controller 120 may compare the measured power consumption with the preset load power reference set, and may diagnose a faulty load among the plurality of loads 10 according to a result of the comparison.

The controller 120 may stop the plurality of loads 10, and then may measure a power consumption consumed whenever the plurality of loads 10 are alternately operated. Then, the controller 120 may compare the measured power consumption with the preset load power reference set, and may diagnose a load corresponding to a power consumption not matching powers included in the preset load power reference set, as a faulty one.

This will be explained in more detail with reference to FIG. 7. Firstly, the plurality of loads 10 (A, B, C, D, E) are stopped, and then the plurality of loads 10 (A, B, C, D, E) are alternately operated in order of A, B, C, D and E. In this case, measured are a power consumption consumed when load 'A' is operated (first power consumption: load 'A'), a power consumption consumed when load 'B' is operated (second power consumption: load 'B'), a power consumption consumed when load 'C' is operated (third power consumption: load 'C'), a power consumption consumed when load 'D' is operated (fourth power consumption: load D'), and a power consumption consumed when load 'E' is operated (fifth power consumption: load 'E'). Then, the controller compares each of the first to fifth power consumptions with the preset load power reference set. In this case, the controller may diagnose a load which has been operated when a power consumption not matching powers included in the preset load power reference set, among the first to fifth power consumptions, is measured, as a faulty one.

For instance, in an example in which a first power consumption (i.e., when only load 'A' is operated) is 20 W; a second power consumption (i.e., when only load 'B' is operated) is 30 W, the third power consumption (i.e., when only load 'C' is operated) is 10 W, the fourth power consumption (i.e., when only load 'D' is operated) is 50 W and the fifth power consumption (i.e., when only load 'E' is operated) is 60 W, the first, second, fourth and fifth power consumptions match power consumptions expected to be consumed when the respective loads are operated. On the contrary, the third power consumption (10 W) does not match an expected power consumption (40 W) associated with operating the load 'C'. Thus, the controller may diagnose that the load 'C', which has been active when the third power consumption is measured, is a faulty load.

Preferably, the controller 120, when diagnosing a fault, may measure a power consumption consumed whenever the plurality of loads 10 are alternately operated, and may compare the measured power consumption with the preset load power reference set, thereby diagnosing a faulty load among the plurality of loads 10. For instance, when each of the first to fifth power consumptions is measured, i.e., whenever the plurality of loads 10 are alternately operated, the controller may compare the measured power consumption with the preset load power reference set to thus diagnose a faulty load. Through these processes, the controller 120 may alternately diagnose the plurality of loads 10 whether they have a fault or not, and may alternately execute a trouble shooting with respect to the plurality of loads 10, thereby diagnosing a fault of the refrigerator 1000.

In a fourth example of diagnosing an occurrence of a fault, the controller 120 compares the power consumption with the preset power reference, and the controller 120 determines that one or more of the plurality of loads 10 operate abnormally when a difference between the power consumption and the preset power reference is out of the preset error range. The controller 120 diagnoses a faulty load among the plurality of loads 10 based on the preset load power reference set. In this case, the controller 120 may alternately stop the plurality of loads 10 for a preset time, and may measure a power consumption consumed whenever the plurality of loads 10 are alternately stopped. Then, the controller 120 may compare the measured power consumption with the preset load power reference set, and may diagnose a faulty load among the plurality of loads 10 according to a result of the comparison.

The controller 120 may measure a power consumption consumed whenever the plurality of loads 10 are alternately stopped and may compare the measured power consumption with a previously-measured power consumption (i.e., a power consumption consumed when the plurality of loads 10 are not stopped). Then, the controller 120 may compare a comparison result with the preset load power reference set, thereby diagnosing a faulty load among the plurality of loads 10 according to a result of the comparison. That is, the controller 120 may measure power consumptions consumed whenever the plurality of loads 10 are alternately stopped, and may compare the measured power consumptions with a power consumption consumed when the plurality of loads 10 are not stopped. Then, the controller 120 may compare differences between the measured power consumptions and the power consumption consumed when the plurality of loads 10 are not stopped, with the preset load power reference set. Then, the controller 120 may diagnose a load corresponding to a difference not matching the preset load power reference set, as a faulty load.

This will be explained in more detail with reference to FIG. 7. Firstly, the plurality of loads 10 (A, B, C, D, E) are alternately stopped in order of A, B, C, D and E. In this case, measured are a power consumption consumed when the plurality of loads 10 are not stopped (a 'zero' power consumption corresponding to load 'A'+load 'B'+load 'C'+load 'D'+load 'E'), a power consumption consumed when load 'A' is stopped (a first power consumption corresponding to load 'B'+load 'C'+load 'D'+load 'E'), a power consumption consumed when load 'B' is stopped (a second power consumption corresponding to load 'A'+load 'C'+load 'D'+load 'E'), a power consumption consumed when load 'C' is stopped (a third power consumption corresponding to load 'A'+load 'B'+load 'D'+load 'E'), a power consumption consumed when load 'D' is stopped (a fourth power consumption corresponding to load 'A'+load 'B'+load 'C'+load 'E'), and a power consumption consumed when load 'E' is stopped (a fifth power consumption corresponding to load 'A'+load 'B'+load 'C'+load D'). Then, the controller 120 compares each of the first to fifth power consumptions with the zero power consumption, and compares differences between the measured power consumptions and the zero power consumption with the preset load power reference set. Then, the controller 120 may diagnose a load stopped at the time of measuring a power consumption corresponding to a difference not matching the preset load power reference set, as a faulty load.

For instance, in a case where the zero power consumption (i.e., when all of loads A-E are active) is 150 W, the first power consumption (i.e., when load 'A' is inactive) is 130 W, the second power consumption (i.e., when load 'B' is inactive) is 120 W, the third power consumption (i.e., when load 'C' is inactive) is 110 W, the fourth power consumption (i.e., when load 'D' is inactive) is 150 W, and the fifth power consumption (i.e., when load 'E' is inactive) is 90 W, the first, second, third and fifth power consumptions match expected changes in power consumptions when the respective loads are stopped. On the contrary, a difference between the zero power consumption and the fourth power consumption (zero watts in this example,) does not match a power consumption change (50 W) that is expected when the load 'D' is stopped. Thus, the controller 120 may diagnose that the load D', which has been stopped when the fourth power consumption is measured, as a faulty load.

Through the above processes, the controller 120 may alternately diagnose the plurality of loads 10 whether they have a fault or not, and may alternately execute a trouble shooting with respect to the plurality of loads 10, thereby diagnosing and addressing a fault of the refrigerator 1000. The controller 120 may diagnose a faulty load among the plurality of loads 10, through at least one of the aforementioned fault diagnosis processes. In case of diagnosing one or more faulty loads among the plurality of loads 10, the controller 120 may stop functions related to the one or more faulty loads. For instance, when an ice maker of the refrigerator 1000 among the plurality of loads 10 is abnormally operated, the controller 120 may stop an ice making function of the ice maker such that the ice making function of the ice maker may be excluded from a driving of the refrigerator 1000.

In case of diagnosing one or more faulty loads among the plurality of loads 10, the controller 120 may generate a notification identifying information about the diagnosis result. For instance, in case of diagnosing one or more faulty loads among the plurality of loads 10, the controller 120 may cause information about the diagnosis result to be displayed on a display unit 300 of the refrigerator 1000 or may control the information to be outputted through an audio output unit (not shown) of the refrigerator 1000. Additionally or alternatively, the controller 120 may transmit (i.e., via a wireless connection) the information about the diagnosis result, to a terminal of a user of the refrigerator 1000, a remote controller for the refrigerator 1000, a remote computer, etc., such that the terminal, the remote controller, computer, etc. may display the diagnosis result of the refrigerator 1000. Through such configurations, a fault diagnosis result of the refrigerator 1000 may be notified to the outside or to a user of the refrigerator 1000.

Hereinafter, a refrigerator disclosed in this specification will be explained in more detail with reference to FIG. 8 and the aforementioned FIGS. 2 to 7. FIG. 8 is a view illustrating a configuration of a refrigerator 1000 disclosed in this specification. The refrigerator 1000 depicted in FIG. 8. may correspond to the refrigerator 1000 depicted in FIGS. 1, 3, and 4.

As depicted in FIG. 8, the refrigerator 1000 may include a plurality of loads 10 (shown as Load #1-Load # n) which consume electric power. The refrigerator 1000 may be driven through operations of the plurality of the loads 10.

The refrigerator 1000 may also include the aforementioned controlling apparatus 100. That is, the controlling apparatus 100 may be an apparatus for controlling the refrigerator and for detecting a fault in one of the loads 10. In the particular configuration shown in FIG. 8, the refrigerator 1000 may include a plurality of loads 10 which consume an electric power, and a microcomputer 100, that functions as a controlling apparatus and is configured to detect an input current to measure a power consumption, configured to compare the measured power consumption with a preset power reference, and configured to diagnose a fault of one or more the plurality of loads 10 according to a result of the comparison.

The refrigerator 1000 may receive a power from an external power source 1. Thus, the refrigerator 1000 may receive a current required to perform its driving from the external power source 1.

The plurality of loads 10 may include at least one load having feedback uncontrollable by the microcomputer 100. That is, the plurality of loads 10 may include loads having feedback controllable by the microcomputer 100, and may include at least one load having feedback uncontrollable by the microcomputer 100.

A configuration of the refrigerator 1000 including the plurality of loads 10 and the microcomputer 100 may be shown in FIG. 4. As shown in FIG. 4, the refrigerator 1000 includes the plurality of loads 11-16 and the microcomputer 100 (i.e., a controlling apparatus). And the refrigerator 1000 may further include at least one of an input unit 200 configured to receive a command from the outside, a display unit 300 configured to display state information, etc. of the refrigerator 1000 to the outside, a memory 400 configured to store therein information about the refrigerator 1000, and a temperature sensor 500 configured to sense a temperature of the refrigerator 1000.

The microcomputer 100 may be the aforementioned controlling apparatus 100. The microcomputer 100 may be a controlling apparatus including a plurality of circuit devices, and formed as a single module. The microcomputer 100 may be a controlling apparatus configured to control an operation of the refrigerator 1000 by controlling the plurality of loads 10. The microcomputer 100 may be a controlling apparatus configured to control the plurality of loads 10 and to diagnose a fault of the plurality of loads 10. The microcomputer 100 may control the plurality of loads 10, and may real-time diagnose a fault of the plurality of loads 10.

The microcomputer 100 detects a current inputted to the refrigerator 1000, and the current inputted to the refrigerator 1000 may be a current inputted when the refrigerator 1000 is being driven, i.e., when energy consumption of the refrigerator 1000 is being executed. The microcomputer 100 may real-time detect a current inputted to the refrigerator 1000. That is, the microcomputer 100 may real-time detect a current inputted to the refrigerator 1000 which is being driven.

The microcomputer 100 may include a current sensor configured to sense a current of a power input unit which applies a power to the refrigerator 1000. The microcomputer 100 may detect a current inputted to the refrigerator 1000 through the current sensor provided at the power input unit. The microcomputer 100 may detect a current inputted to the refrigerator 1000 based on a sensing result received from the current sensor.

The microcomputer 100 measures a power consumption of the refrigerator 1000 based on a result of the detection, and compares the measured power consumption with the preset power reference. Then, the microcomputer 100 diagnoses a fault of the plurality of loads 10 included in the refrigerator 1000 based on a result of the comparison. The microcomputer 100 may diagnose a fault of the plurality of loads 10 through the processes shown in FIG. 5. The microcomputer 100 may receive the detection result from the current sensor, and may measure a power consumption of the refrigerator 1000 based on the detection result (S1). The microcomputer 100 may measure the power consumption, based on the detection result and a rated voltage of the refrigerator 1000.

The microcomputer 100 may compare the measured power consumption with the preset power reference, and may diagnose a fault of the plurality of loads 10 included in the refrigerator 1000 based on a result of the comparison (S2). The preset power reference may be a reference with respect to an entire rated power consumption consumed by the refrigerator 1000 or the plurality of loads 10 while the refrigerator 1000 is performing a full-load operation.

The microcomputer 100 may measure the power consumption real-time consumed by the refrigerator 1000, and may compare the measured power consumption with the preset power reference (reference with respect to an entire rated power consumption of the refrigerator 1000). If the power consumption is different from the preset power reference as a result of the comparison, the microcomputer may determine that at least one of the plurality of loads 10 included in the refrigerator 1000 has a fault. Then, the microcomputer may diagnose whether the plurality of loads 10 are operated normally or abnormally, by comparing the power consumption with the preset power reference. If a difference between the power consumption and the preset power reference is within a preset error range, the microcomputer 100 may determine that the plurality of loads 10 operate normally. The preset error range may be an allowable error range of the preset power reference.

If a difference between the power consumption and the preset power reference is within a preset error range, the microcomputer 100 may determine that the plurality of loads 10 operate normally as energy consumption of the plurality of loads 10 is normally executed. If a difference between the power consumption and the preset power reference is within the preset error range, the microcomputer 100 may diagnose that the plurality of loads 10 operate normally to have no fault.

If it is diagnosed that the plurality of loads 10 have no fault, the microcomputer 100 may control the driving state of the refrigerator 1000 to be maintained. If it is diagnosed that the plurality of loads 10 have no fault, the microcomputer 100 may control the plurality of loads 10 such that the driving state of the refrigerator 1000 may be maintained.

If a difference between the power consumption and the preset power reference is out of the preset error range, the microcomputer 100 may determine that at least one of the plurality of loads 10 has a fault. If a difference between the power consumption and the preset power reference is out of the preset error range, the microcomputer 100 may determine that energy consumption of at least one of the plurality of loads 10 is abnormally executed, and thus the at least one of the plurality of loads 10 has a fault. If a difference between the power consumption and the preset power reference is out of the preset error range, the microcomputer 100 may determine that at least one of the plurality of loads 10 has a fault, and may diagnose a faulty load among the plurality of loads 10 (S3).

If it is determined that at least one of the plurality of loads 10 has a fault as a result of comparing the power consumption with the preset power reference, the microcomputer 100 may diagnose a faulty load among the plurality of loads 10 based on a preset load power reference set. The preset load power reference set may be a reference with respect to a rated power consumption of each of the plurality of loads 10. That is, the preset power reference may be a sum of rated power consumptions of the plurality of loads 10 included in the preset load power reference set. The preset load power reference set may be set as rated power consumptions of the plurality of loads 10 are implemented in the form of a table. For instance, an example of the preset load power reference set is shown in FIG. 7.

If it is determined that at least one of the plurality of loads 10 has a fault, the microcomputer 100 may diagnose a faulty load among the plurality of loads 10 based on the power consumption and the preset load power reference set. Hereinafter, an embodiment to diagnose a fault by the microcomputer 100 will be explained with reference to the aforementioned embodiment to diagnose a fault by the controlling apparatus. In this case, the same explanations as those in the aforementioned controlling apparatus will be omitted, and only an embodiment of the microcomputer 100 of the refrigerator 1000 will be explained.

Like the aforementioned first example to diagnose occurrence of a fault, the microcomputer 100 compares the power consumption with the preset power reference, and determines that one or more of the plurality of loads 10 operate abnormally when a difference between the power consumption and the preset power reference is out of the preset error range. Then, the microcomputer 100 diagnoses a faulty load among the plurality of loads 10, based on the preset load power reference set. In this case, the microcomputer 100 may diagnose a load corresponding to the difference between the power consumption and the preset power reference, among loads included in the preset load power reference set, as a faulty one.

Like the aforementioned second example to diagnose occurrence of a fault, the microcomputer 100 compares the power consumption with the preset power reference, and determines that one or more of the plurality of loads 10 operate abnormally when a difference between the power consumption and the preset power reference is out of the preset error range. Then, the microcomputer 100 diagnoses a faulty load among the plurality of loads 10, based on the preset load power reference set. In this case, the microcomputer 100 may stop the plurality of loads 10, and then sequentially operate the plurality of loads 10 for a preset time. The microcomputer 100 may measure a power consumption consumed whenever the plurality of loads 10 are sequentially operated. Then, the microcomputer 100 may compare the measured power consumption with the preset load power reference set, and may diagnose a faulty load among the plurality of loads 10 according to a result of the comparison. Through the above processes, the microcomputer 100 may sequentially diagnose the plurality of loads 10 whether they have a fault or not, and may sequentially execute a trouble shooting with respect to the plurality of loads 10, thereby diagnosing a fault of the refrigerator 1000.

Like the aforementioned third example to diagnose occurrence of a fault, the microcomputer 100 compares the power consumption with the preset power reference, and determines that one or more of the plurality of loads 10 operate abnormally when a difference between the power consumption and the preset power reference is out of the preset error range. The microcomputer 100 diagnoses a faulty load among the plurality of loads 10, based on the preset load power reference set. In this case, the microcomputer 100 may stop the plurality of loads 10, and then alternately operate the plurality of loads 10 for a preset time. The microcomputer 100 may measure a power consumption consumed whenever the plurality of loads 10 are alternately operated. Then, the microcomputer 100 may compare the measured power consumption with the preset load power reference set, and may diagnose a faulty load among the plurality of loads 10 according to a result of the comparison. Through the above processes, the microcomputer 100 may alternately diagnose the plurality of loads 10 whether they have a fault or not, and may alternately execute a trouble shooting with respect to the plurality of loads 10, thereby diagnosing a fault of the refrigerator 1000.

Like the aforementioned third example to diagnose occurrence of a fault, the microcomputer 100 compares the power consumption with the preset power reference, and determines that one or more of the plurality of loads 10 operate abnormally when a difference between the power consumption and the preset power reference is out of the preset error range. The microcomputer 100 diagnoses a faulty load among the plurality of loads 10, based on the preset load power reference set. In this case, the microcomputer 100 may alternately stop the plurality of loads 10 for a preset time, and may measure a power consumption consumed whenever the plurality of loads 10 are alternately stopped. Then, the microcomputer 100 may compare the measured power consumption with the preset load power reference set, and may diagnose a faulty load among the plurality of loads 10 according to a result of the comparison. Through the above processes, the microcomputer 100 may alternately diagnose the plurality of loads 10 whether they have a fault or not, and may alternately execute a trouble shooting with respect to the plurality of loads 10, thereby diagnosing a fault of the refrigerator 1000.

The microcomputer 100 may diagnose a faulty load among the plurality of loads 10, through at least one of the aforementioned fault diagnosis processes. In case that one or more faulty loads among the plurality of loads 10 are identified as having a fault, the microcomputer 100 may stop functions related to the one or more faulty loads. For instance, when an ice maker of the refrigerator 1000 among the plurality of loads 10 is abnormally operated, the microcomputer 100 may stop an ice making function of the ice maker such that the ice making function of the ice maker may be excluded from a driving of the refrigerator 1000. Thus, the microcontroller 100 may improve the reliability and safety of the refrigerator 1000 by stopping the operation of a faulty part. For example, if a short-circuit occurs in one of the loads 10, deactivating that faulty load 10 may prevent electrical power from being inadvertently applied to another component and/or to a user.

In case of diagnosing one or more faulty loads among the plurality of loads 10, the microcomputer 100 may cause information about the diagnosis result, to be notified to the outside. For instance, in case of diagnosing one or more faulty loads among the plurality of loads 10, the microcomputer 100 may cause information about the diagnosis result to be displayed on a display unit 300 of the refrigerator 1000, or may cause the information to be notified through an audio output unit (not shown) of the refrigerator 1000. Additionally or alternatively, the microcomputer 100 may transmit the information about the diagnosis result to a terminal of a user of the refrigerator 1000, a remote controller for the refrigerator 1000, a remote computer, etc., such that the terminal, the remote controller, remote computer, etc. may receive, store, and process the diagnosis result of the refrigerator 1000. Through such configurations, a fault diagnosis result of the refrigerator 1000 may be notified to the outside or to a user of the refrigerator 1000.

Hereinafter, a method for diagnosing a fault of a refrigerator according to the present application will be explained with reference to FIGS. 9 to 11. A method for diagnosing a fault of a refrigerator disclosed in this specification (hereinafter, will be referred to as a diagnosis method) may be the aforementioned method for diagnosing a fault of a refrigerator. The diagnosis method may be used to diagnose the aforementioned apparatus for controlling a refrigerator. The diagnosis method may be performed by the apparatus for controlling a refrigerator, or a microcomputer of the refrigerator. The diagnosis method may be used to diagnose the aforementioned refrigerator 1000.

The diagnosis method may be applied to the aforementioned apparatus for controlling a refrigerator, a control program of the microcomputer of the refrigerator, software and applications. For convenience, the diagnosis method will be explained in an assumption that it is applied to the control apparatus 100 or the microcomputer 100 of the refrigerator 1000.

Figure 9:
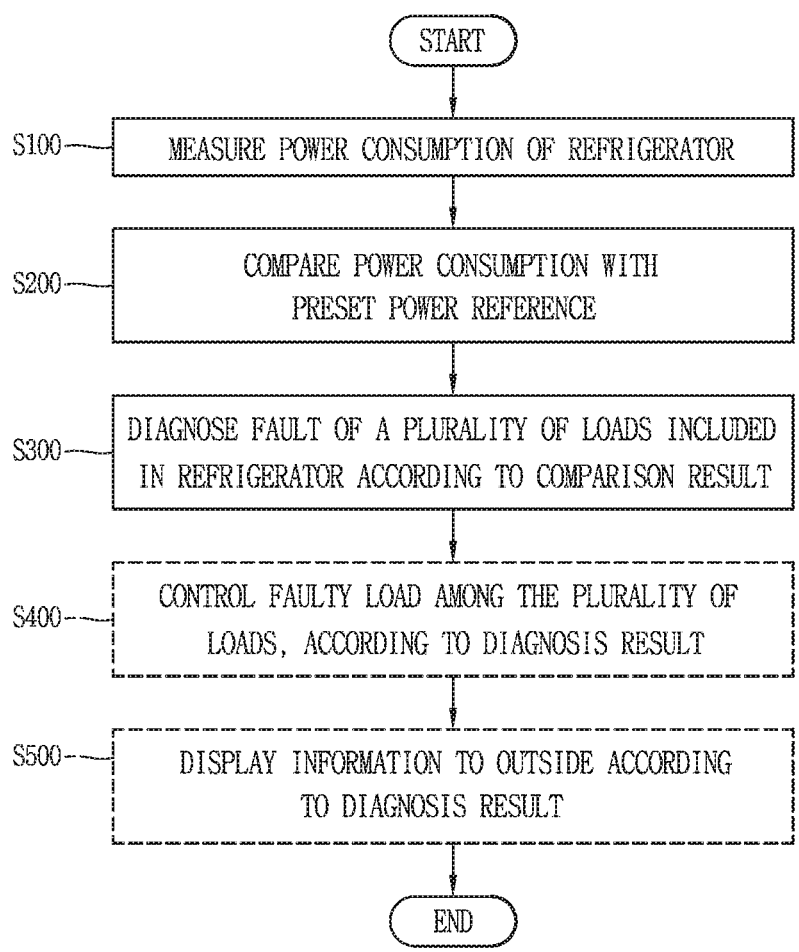
FIG. 9 is a flowchart illustrating processes of a method for diagnosing a fault of a refrigerator according to the present application.

As shown in FIG. 9, the diagnosis method includes measuring a power consumption of a refrigerator by detecting a current inputted to the refrigerator (S100), comparing the power consumption with a preset power reference (S200), and diagnosing a fault of a plurality of loads included in the refrigerator according to a result of the comparison (S300).

In S100 of measuring a power consumption of a refrigerator, a current inputted to the refrigerator is detected. The current inputted to the refrigerator may be a current inputted in a state where the refrigerator is being driven, that is, in a state where energy consumption of the refrigerator is being executed. In S100 of measuring a power consumption of a refrigerator, a current inputted to the refrigerator may be real-time detected. In S100 of measuring a power consumption of a refrigerator, a current of a power input unit which applies a power to the refrigerator 1000 may be detected. In S100 of measuring a power consumption of a refrigerator, a power consumption of the refrigerator may be measured based on a result of the current detection.

In S100 of measuring a power consumption of a refrigerator, a power consumption of the refrigerator may be measured based on a result of the current detection and a rated voltage of the refrigerator. The rated voltage of the refrigerator may be a prevailing voltage applied to the refrigerator, which may be 220V or 110V for instance. Preferably, the rated voltage of the refrigerator may be 220V. In S100 of measuring a power consumption of a refrigerator, the power consumption may be measured by multiplying the current detection result by the rated voltage of the refrigerator, as described above with respect to Equation 1.

In S200 of comparing the power consumption with a preset power reference (S200), the power consumption of the refrigerator measured in S100 may be compared with a preset power reference. The preset power reference may be a reference with respect to a sum of rated power consumptions consumed by the plurality of loads while the refrigerator is performing a full-load operation. The preset power reference may be a reference with respect to an entire rated power consumption consumed by the refrigerator or the plurality of loads while the refrigerator is performing a full-load operation.

In S200 of comparing the power consumption with a preset power reference (S200), the power consumption may be compared with the preset power reference. Then, it may be determined whether a difference between the power consumption and the preset power reference is within a preset error range. The preset error range may be an allowable error range of the preset power reference.

In S300 of diagnosing a fault of a plurality of loads, a fault of the plurality of loads may be determined according to a result of comparing the power consumption with the preset power reference. In S300 of diagnosing a fault of a plurality of loads, if a difference between the power consumption and the preset power reference is within the preset error range, it may be determined that that energy consumption of the plurality of loads is normally executed and thus the plurality of loads operate normally.

In S300 of diagnosing a fault of a plurality of loads, if a difference between the power consumption and the preset power reference is within the preset error range, it may be diagnosed that the plurality of loads are normally operated to have no fault. In S300 of diagnosing a fault of a plurality of loads, if a difference between the power consumption and the preset power reference is out of the preset error range, it may be determined that at least one of the plurality of loads has a fault.

In S300 of diagnosing a fault of a plurality of loads, if a difference between the power consumption and the preset power reference is out of the preset error range, it may be determined that energy consumption of at least one of the plurality of loads is abnormally executed, and thus the at least one of the plurality of loads has a fault. In S300 of diagnosing a fault of a plurality of loads, if a difference between the power consumption and the preset power reference is out of the preset error range, it may be determined that at least one of the plurality of loads has a fault, and a faulty load among the plurality of loads may be diagnosed.

As shown in FIG. 10, S300 of diagnosing a fault of a plurality of loads may include diagnosing a faulty load among the plurality of loads based on a preset load power reference set when a difference between the power consumption and the preset power reference is out of the preset error range (S310). The preset load power reference set may be a reference with respect to a rated power consumption of each of the plurality of loads. The preset load power reference set may be formed as rated power consumptions of the plurality of loads are implemented in the form of a table.

In S310 of diagnosing a faulty load among the plurality of loads, a faulty load among the plurality of loads may be diagnosed based on the power consumption and the preset load power reference set. S310 of diagnosing a faulty load among the plurality of loads may include diagnosing a load corresponding to a difference between the power consumption and the preset power reference, among loads included in the preset load power reference set, as a faulty one (S320). In S320 of diagnosing a load corresponding to a difference between the power consumption and the preset power reference as a faulty one, like in the aforementioned first example to diagnose occurrence of a fault, it may be diagnosed that a load corresponding to a difference between the power consumption and the preset power reference, among loads included in the preset load power reference set, has a fault.

As shown in FIG. 11A, S310 of diagnosing a faulty load among the plurality of loads may include stopping the plurality of loads and then sequentially operating the plurality of loads for a preset time (S311a), measuring a power consumption consumed whenever the plurality of loads are sequentially operated (S312a), and comparing the measured power consumption with the preset load power reference set, and diagnosing a faulty load among the plurality of loads according to a result of the comparison (S313a).

In the case where S310 of diagnosing a faulty load among the plurality of loads includes the above steps, like in the aforementioned second example to diagnose occurrence of a fault, the following processes may be executed. Firstly, the plurality of loads may be stopped and then the plurality of loads may be sequentially operated (S311a). Then, a power consumption consumed whenever the plurality of loads are sequentially operated may be measured (S312a). Then, the measured power consumption may be compared with the preset load power reference set, and it may be determined that a load corresponding to a power consumption not matching powers included in the preset load power reference set, has a fault (S313a).

In S310 of diagnosing a faulty load among the plurality of loads, the following processes may be preferably executed. Firstly, a power consumption is measured (S312a) whenever the plurality of loads are sequentially operated (S311a). Then, the measured power consumption may be compared with the preset load power reference set, and a faulty load among the plurality of loads may be diagnosed according to a result of the comparison (S313a). Through the above processes, the plurality of loads may be sequentially diagnosed whether they have a fault or not, and a trouble shooting may be sequentially executed with respect to the plurality of loads to thus diagnose a fault of the refrigerator.

Figure 11B:
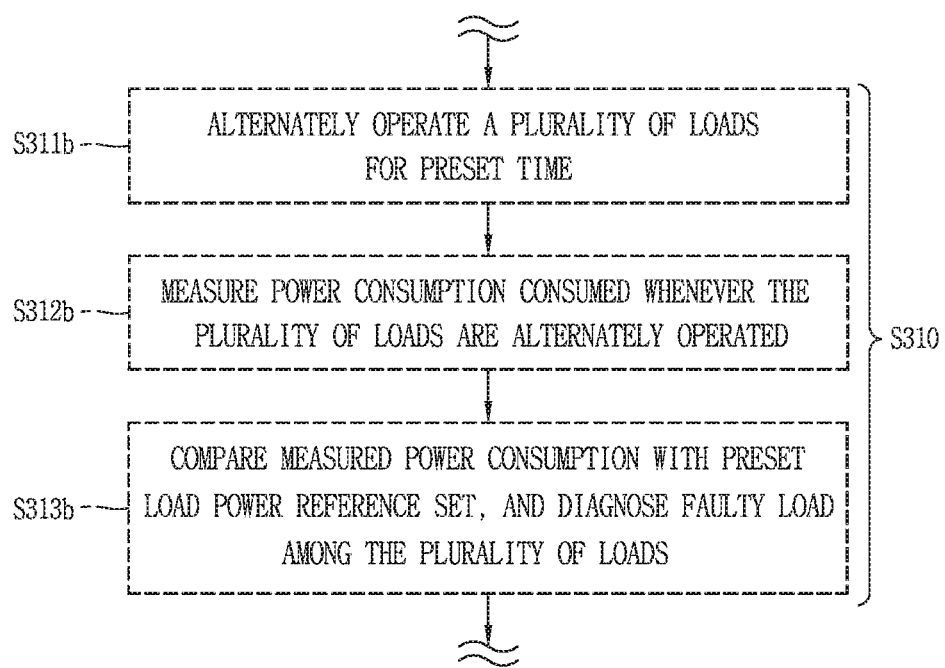
FIG. 11B is a second flowchart illustrating processes of diagnosing a faulty load according to an embodiment of a method for diagnosing a fault of a refrigerator according to the present application.

As shown in FIG. 11B, S310 of diagnosing a faulty load among the plurality of loads may include stopping the plurality of loads and then alternately operating the plurality of loads for a preset time (S311b), measuring a power consumption consumed whenever the plurality of loads are alternately operated (S312b), and comparing the measured power consumption with the preset load power reference set, and diagnosing a faulty load among the plurality of loads according to a result of the comparison (S313b).

In the case where S310 of diagnosing a faulty load among the plurality of loads includes the above steps, like in the aforementioned third example to diagnose occurrence of a fault, the following processes may be executed. Firstly, the plurality of loads may be stopped and then the plurality of loads may be alternately operated (S311b). Then, a power consumption consumed whenever the plurality of loads are alternately operated may be measured (S312b). Then, the measured power consumption may be compared with the preset load power reference set, and it may be determined that a load corresponding to a power consumption not matching powers included in the preset load power reference set, has a fault (S313b).

In S310 of diagnosing a faulty load among the plurality of loads, the following processes may be preferably executed. Firstly, a power consumption is measured (S312b) whenever the plurality of loads are alternately operated (S311b). Then, the measured power consumption may be compared with the preset load power reference set, and a faulty load among the plurality of loads may be diagnosed according to a result of the comparison (S313b). Through the above processes, the plurality of loads may be alternately diagnosed whether they have a fault or not, and a trouble shooting may be alternately executed with respect to all of the plurality of loads to thus diagnose a fault of the refrigerator.

Figure 11C:
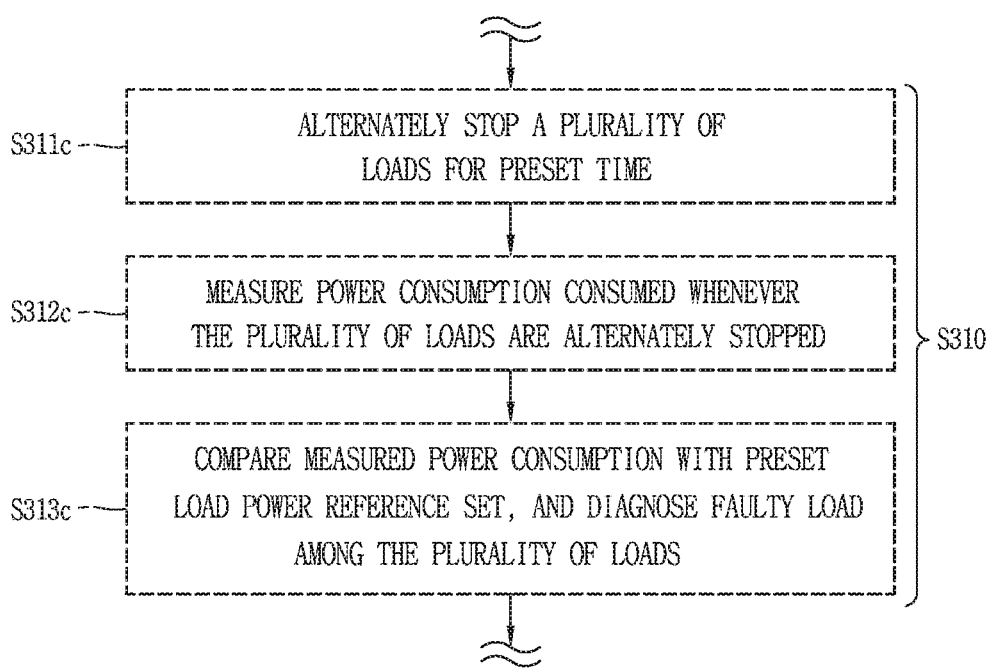
FIG. 11C is a third flowchart illustrating processes of diagnosing a faulty load according to an embodiment of a method for diagnosing a fault of a refrigerator according to the present application.

As shown in FIG. 11C, S310 of diagnosing a faulty load among the plurality of loads may include alternately stopping the plurality of loads for a preset time (S311c), measuring a power consumption consumed whenever the plurality of loads are alternately stopped (S312c), and comparing the measured power consumption with the preset load power reference set, and diagnosing a faulty load among the plurality of loads according to a result of the comparison (S313c).

In the case where S310 of diagnosing a faulty load among the plurality of loads includes the above steps, like in the aforementioned fourth example to diagnose occurrence of a fault, the following processes may be executed. Firstly, the plurality of loads may be alternately stopped (S311c). Then, a power consumption consumed whenever the plurality of loads are alternately stopped may be measured (S312c). Then, the measured power consumption may be compared with a previously-measured power consumption (i.e., a power consumption consumed when the plurality of loads are not stopped). Then, a comparison result may be compared with the preset load power reference set, and a faulty load among the plurality of loads may be diagnosed according to a result of the comparison (S313c). Through the above processes, the plurality of loads may be alternately diagnosed whether they have a fault or not, and a trouble shooting may be alternately executed with respect to all of the plurality of loads to thus diagnose a fault of the refrigerator.

Referring to FIG. 9, the diagnosing method may further include controlling a faulty load among the plurality of loads according to a diagnosis result (S400). In S400 of controlling a faulty load among the plurality of loads, in case of diagnosing one or more faulty loads among the plurality of loads, functions related to the one or more faulty loads may be stopped. For instance, when an ice maker of the refrigerator among the plurality of loads is abnormally operated, an ice making function of the ice maker may be stopped such that the ice making function of the ice maker may be excluded from a driving of the refrigerator.

The diagnosing method may further include displaying (or outputting) information about a diagnosis result to the outside (S500). In S500 of displaying information about a diagnosis result to the outside, in case of diagnosing one or more faulty loads among the plurality of loads, information about the diagnosis result may be displayed on a display unit of the refrigerator, or may be notified through an audio output unit of the refrigerator. Alternatively, the information about the diagnosis result may be transmitted to a terminal of a user of the refrigerator, a remote controller for the refrigerator, etc., such that the terminal, the remote controller, etc. may display the diagnosis result of the refrigerator.

The apparatus for controlling a refrigerator, the refrigerator, and the method for diagnosing a fault of a refrigerator disclosed in this specification may have the following technical effects. Firstly, a power consumption of the refrigerator may be measured, and a fault of a plurality of loads included in the refrigerator may be diagnosed based on the measured power consumption. Accordingly, all of the plurality of loads included in the refrigerator may be diagnosed whether they have a fault or not. Further, whether the plurality of loads included in the refrigerator have a fault or not may be automatically diagnosed without a user's manual operation. Besides, whether the plurality of loads included in the refrigerator have a fault or not may be diagnosed without an additional configuration for fault diagnosis. This may solve the conventional problems, and may achieve the tasks of the present application. Therefore, an aspect of the detailed description is to provide an apparatus for controlling a refrigerator capable of executing a fault diagnosis even with respect to loads having feedback uncontrollable among loads included in the refrigerator, a refrigerator, and a method for diagnosing a refrigerator.

Another aspect of the detailed description is to provide an apparatus for controlling a refrigerator capable of automatically diagnosing a fault of loads included in the refrigerator without a user's manual operation, a refrigerator, and a method for diagnosing a refrigerator. Another aspect of the detailed description is to provide an apparatus for controlling a refrigerator capable of diagnosing a fault of loads included in the refrigerator without an additional configuration for fault diagnosis while the refrigerator is being driven, a refrigerator, and a method for diagnosing a refrigerator.

In order to solve the conventional problems and to achieve tasks of the present application, an apparatus for controlling a refrigerator, a refrigerator, and a method for diagnosing a refrigerator may be provided to measure a power consumption of a refrigerator, and to diagnose a fault with respect to each of a plurality of loads included in the refrigerator. That is, in order to solve the conventional problems and to achieve tasks of the present application, an apparatus for controlling a refrigerator, a refrigerator, and a method for diagnosing a refrigerator may be provided to diagnose a fault of loads based on a power consumption consumed while the refrigerator is being driven. For instance, a load having feedback uncontrollable may be diagnosed whether it has a fault or not, based on a measured power consumption of the load.

Further, a power consumption consumed while the refrigerator is being driven may be measured, and a fault diagnosis may be executed based on the measured power consumption. This may allow a load fault diagnosis to be executed without an additional manipulation. Further, a power consumption consumed while the refrigerator is being driven may be measured, and a fault diagnosis may be executed based on the measured power consumption. This may allow a load fault diagnosis to be executed without an additional configuration for fault diagnosis, and without an additional measuring process.

To achieve these and other advantages and in accordance with the purpose of this specification, as embodied and broadly described herein, there is provided an apparatus for controlling a refrigerator, including: a detection unit configured to detect a current inputted to a refrigerator; and a controller configured to measure a power consumption of the refrigerator based on a detection result by the detection unit, to compare the measured power consumption with a preset power reference, and to diagnose a fault of a plurality of loads included in the refrigerator according to a result of the comparison.

In an embodiment of the apparatus for controlling a refrigerator, the detection unit may detect a current of a power input unit which applies a power to the refrigerator. In an embodiment of the apparatus for controlling a refrigerator, the controller may measures the power consumption based on the detection result and a rated voltage of the refrigerator.

In an embodiment of the apparatus for controlling a refrigerator, if a difference between the power consumption and the preset power reference is within a preset error range, the controller may determine that the plurality of loads are normally operated. In an embodiment of the apparatus for controlling a refrigerator, if a difference between the power consumption and the preset power reference is out of a preset error range, the controller may determine that at least one of the plurality of loads has a fault.

In an embodiment of the apparatus for controlling a refrigerator, if it is determined that at least one of the plurality of loads has a fault as a result of comparing the power consumption with the preset power reference, the controller may diagnose a faulty load among the plurality of loads, based on a preset load power reference set. In an embodiment of the apparatus for controlling a refrigerator, the preset load power reference set may be a reference with respect to a rated power consumption of each of the plurality of loads.

In an embodiment of the apparatus for controlling a refrigerator, the controller may diagnose a load corresponding to a difference between the power consumption and the preset power reference, among loads included in the preset load power reference set, as a faulty one. In an embodiment of the apparatus for controlling a refrigerator, the controller may stop the plurality of loads, and then may sequentially operate the plurality of loads for a preset time. The controller may measure a power consumption consumed whenever the plurality of loads are sequentially operated, may compare the measured power consumption with the preset load power reference set, and may diagnose a faulty load among the plurality of loads according to a result of the comparison.

In an embodiment of the apparatus for controlling a refrigerator, the controller may stop the plurality of loads, and then may alternately operate the plurality of loads for a preset time. The controller may measure a power consumption consumed whenever the plurality of loads are alternately operated, may compare the measured power consumption with the preset load power reference set, and may diagnose a faulty load among the plurality of loads according to a result of the comparison.

In an embodiment of the apparatus for controlling a refrigerator, the controller may alternately stop the plurality of loads for a preset time. The controller may measure a power consumption consumed whenever the plurality of loads are alternately stopped, may compare the measured power consumption with the preset load power reference set, and may diagnose a faulty load among the plurality of loads according to a result of the comparison.

In an embodiment of the apparatus for controlling a refrigerator, in case of diagnosing one or more faulty loads among the plurality of loads, the controller may stop functions related to the one or more faulty loads. In an embodiment of the apparatus for controlling a refrigerator, in case of diagnosing one or more faulty loads among the plurality of loads, the controller may control information about the diagnosis result, to be notified to outside.

To achieve these and other advantages and in accordance with the purpose of this specification, as embodied and broadly described herein, there is also provided a refrigerator, including: a plurality of loads which consume an electric power; and a microcomputer configured to detect an input current to measure a power consumption, configured to compare the measured power consumption with a preset power reference, and configured to diagnose a fault of the plurality of loads according to a result of the comparison. In an embodiment of the refrigerator, the plurality of loads may include one or more loads having feedback uncontrollable by the microcomputer.

In an embodiment of the refrigerator, the microcomputer may include a current sensor configured to detect a current of a power input unit which applies a power to the refrigerator. In an embodiment of the refrigerator, the microcomputer may measure the power consumption based on the detection result and a rated voltage of the refrigerator.

In an embodiment of the refrigerator, if a difference between the power consumption and the preset power reference is within a preset error range, the controller may determine that the plurality of loads are normally operated. In an embodiment of the refrigerator, if a difference between the power consumption and the preset power reference is out of a preset error range, the microcomputer may determine that at least one of the plurality of loads has a fault.

In an embodiment of the refrigerator, if it is determined that at least one of the plurality of loads has a fault as a result of comparing the power consumption with the preset power reference, the microcomputer may diagnose a faulty load among the plurality of loads, based on a preset load power reference set. In an embodiment of the refrigerator, the preset load power reference set may be a reference with respect to a rated power consumption of each of the plurality of loads.

In an embodiment of the refrigerator, the microcomputer may diagnose a load corresponding to a difference between the power consumption and the preset power reference, among loads included in the preset load power reference set, as a faulty one. In an embodiment of the refrigerator, the microcomputer may stop the plurality of loads, and then may sequentially operate the plurality of loads for a preset time. The microcomputer may measure a power consumption consumed whenever the plurality of loads are sequentially operated, may compare the measured power consumption with the preset load power reference set, and may diagnose a faulty load among the plurality of loads according to a result of the comparison.

In an embodiment of the refrigerator, the microcomputer may stop the plurality of loads, and then may alternately operate the plurality of loads for a preset time. The microcomputer may measure a power consumption consumed whenever the plurality of loads are alternately operated, may compare the measured power consumption with the preset load power reference set, and may diagnose a faulty load among the plurality of loads according to a result of the comparison.

In an embodiment of the refrigerator, the microcomputer may alternately stop the plurality of loads for a preset time. The microcomputer may measure a power consumption consumed whenever the plurality of loads are alternately stopped, may compare the measured power consumption with the preset load power reference set, and may diagnose a faulty load among the plurality of loads according to a result of the comparison.

In an embodiment of the refrigerator, in case of diagnosing one or more faulty loads among the plurality of loads, the microcomputer may stop functions related to the one or more faulty loads. In an embodiment of the refrigerator, in case of diagnosing one or more faulty loads among the plurality of loads, the microcomputer may control information about the diagnosis result, to be notified to outside.

To achieve these and other advantages and in accordance with the purpose of this specification, as embodied and broadly described herein, there is also provided a method for diagnosing a fault of a refrigerator, including: measuring a power consumption of a refrigerator by detecting a current inputted to the refrigerator; comparing the power consumption with a preset power reference; and diagnosing a fault of a plurality of loads included in the refrigerator according to a result of the comparison.

In an embodiment of the method, the diagnosing a fault of a plurality of loads may include diagnosing a faulty load among the plurality of loads, based on a preset load power reference set, if a difference between the power consumption and the preset power reference is out of a preset error range. In an embodiment of the method, the preset load power reference set may be a reference with respect to a rated power consumption of each of the plurality of loads.

In an embodiment of the method, the diagnosing a faulty load among the plurality of loads may include diagnosing a load corresponding to a difference between the power consumption and the preset power reference, among loads included in the preset load power reference set, as a faulty one.

In an embodiment of the method, the diagnosing a faulty load among the plurality of loads may include: stopping the plurality of loads, and then sequentially operating the plurality of loads for a preset time; measuring a power consumption consumed whenever the plurality of loads are sequentially operated; and comparing the measured power consumption with the preset load power reference set, and diagnosing a faulty load among the plurality of loads according to a result of the comparison.

In an embodiment of the method, the diagnosing a faulty load among the plurality of loads may include: stopping the plurality of loads, and then alternately operating the plurality of loads for a preset time; measuring a power consumption consumed whenever the plurality of loads are alternately operated; and comparing the measured power consumption with the preset load power reference set, and diagnosing a faulty load among the plurality of loads according to a result of the comparison.

In an embodiment of the method, the diagnosing a faulty load among the plurality of loads may include: alternately stopping the plurality of loads for a preset time; measuring a power consumption consumed whenever the plurality of loads are alternately stopped; and comparing the measured power consumption with the preset load power reference set, and diagnosing a faulty load among the plurality of loads according to a result of the comparison.

In an embodiment of the method, the method may further include controlling a faulty load among the plurality of loads according to a diagnosis result. In an embodiment of the method, the method may further include displaying information about the diagnosis result to outside.

The apparatus for controlling a refrigerator, the refrigerator, and the method for diagnosing a fault of a refrigerator according to the present application may have the following advantages. Firstly, a power consumption of the refrigerator may be measured, and a fault of each of a plurality of loads included in the refrigerator may be diagnosed based on the measured power consumption. Accordingly, all of the plurality of loads included in the refrigerator may be diagnosed whether they have a fault or not. Accordingly, even a load having feedback uncontrollable may be diagnosed whether it has a fault or not.

Further, a power consumption of the refrigerator may be measured, and a fault of each of a plurality of loads included in the refrigerator may be diagnosed based on the measured power consumption. Accordingly, whether the plurality of loads included in the refrigerator have a fault or not may be automatically diagnosed without a user's manual operation. This may enhance convenience, safety, utilization and maintenance/repair of the refrigerator, and may allow the refrigerator to undergo fault diagnosis easily and simply.

Besides, a power consumption of the refrigerator may be measured, and a fault of each of a plurality of loads included in the refrigerator may be diagnosed based on the measured power consumption. This may allow the loads included in the refrigerator to be diagnosed without an additional configuration for fault diagnosis, while the refrigerator is being operated. Accordingly, a configuration to diagnose a fault and to check maintenance/repair may be simplified, a design of the refrigerator may be simplified, and thus the refrigerator may have a long lifespan.

Further scope of applicability of the present application will become more apparent from the detailed description given hereinafter. However, it should be understood that the detailed description and specific examples, while indicating preferred embodiments of the application, are given by way of illustration only, since various changes and modifications within the spirit and scope of the application will become apparent to those skilled in the art from the detailed description.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

Any reference in this specification to "one embodiment," "an embodiment," "example embodiment," etc., means that a particular feature, structure, or characteristic described in connection with the embodiment is included in at least one embodiment of the application. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for controlling a refrigerator, comprising:
a detector configured to measure a current inputted to a refrigerator; and
a controller configured to:
determine a power consumption of the refrigerator based on the current measured by the detector,
compare the power consumption with a prescribed power reference, and
diagnose a fault in one or more of a plurality of loads included in the refrigerator based on comparing the power consumption with the prescribed power reference,
wherein the detector is configured to measure a total current inputted to the refrigerator at a power input which applies power to the refrigerator,
wherein the controller is configured to determine a total power consumption of the refrigerator based on the total current and diagnose the fault in one or more of the plurality of loads based on the total power consumption,
wherein the controller, when diagnosing the fault, is further configured to diagnose a faulty load among the plurality of loads based on a load power reference set,
wherein the load power reference set identifies a reference rated power consumption of each of the plurality of loads, and
wherein, when diagnosing the faulty load, the controller:
stops the plurality of loads during a first time period,
sequentially reactivates the plurality of loads after stopping the plurality of loads, sequentially reactivating the plurality of loads including activating a first load, of the plurality of loads, during a second time period after the first time period, and activating both the first load and a second load, of the plurality of loads, during a third time period after the second time period,
measures the total power consumption as the plurality of loads are sequentially reactivated,
compares the total power consumption with the load power reference set, the load power reference set including a first reference rated power consumption associated with the first load, and a second reference rated power consumption associated with the second load, and diagnoses the faulty load among the plurality of loads based on comparing the measured power consumptions with the load power reference set, the first load being diagnosed as faulty when a change in the total power consumption between the first and second time periods differs from the first reference rated power consumption by at least a prescribed amount, and the second load being diagnosed as faulty when a change in the total power consumption between the second and third time periods differs from the second reference rated power consumption by at least the prescribed amount.

2. The apparatus of claim 1, wherein the controller, when determining the power consumption, is further configured to determine the power consumption based on the current measured by the detector and a rated voltage of the refrigerator.

3. The apparatus of claim 1, wherein if a difference between the power consumption and the prescribed power reference exceeds a threshold, the controller determines that at least one of the plurality of loads has a fault.

4. The apparatus of claim 1, wherein the controller diagnoses, as the faulty node, one of the plurality of loads having an associated reference rated power consumption identified in the load power reference set that corresponds to a difference between the power consumption and the prescribed power reference.

5. The apparatus of claim 1, wherein the controller is further configured to stop functions related to the one or more loads associated with the fault.

6. The apparatus of claim 1, wherein the controller is further configured to output information about the fault.

7. A refrigerator, comprising:
a plurality of loads which consume an electric power; and
a microcomputer configured to:
   detect an input current,
   measure a power consumption based on the detected input current,
   compare the power consumption with a prescribed power reference, and
   diagnose a fault in one or more of the plurality of loads based on comparing the power consumption and the prescribed power reference
wherein the microcomputer includes a current sensor configured to detect a total current of a power input which applies power to the refrigerator,
wherein the microcomputer is configured to determine a total power consumption of the refrigerator and diagnose the fault in one or more of the plurality of loads based on the total power consumption,
wherein the microcomputer, when diagnosing the fault, is further configured to identify a faulty load among the plurality of loads based on a load power reference set,
wherein the load power reference set identifies a reference power consumption of each of the plurality of loads, and
wherein, when diagnosing the faulty load, the microcomputer:
   stops the plurality of loads during a first time period,
   sequentially reactivates the plurality of loads after stopping the plurality of loads, sequentially reactivating the plurality of loads including activating a first load, of the plurality of loads, during a second time period after the first time period, and activating both the first load and a second load, of the plurality of loads, during a third time period after the second time period,
   measures the total power consumption as the plurality of loads are sequentially reactivated,
   compares the total power consumption with the load power reference set, the load power reference set including a first reference rated power consumption associated with the first load, and a second reference rated power consumption associated with the second load, and
   diagnoses the faulty load among the plurality of loads based on comparing the measured power consumptions with the load power reference set, the first load being diagnosed as faulty when a change in the total power consumption between the first and second time periods differs from the first reference rated power consumption by at least a prescribed amount, and the second load being diagnosed as faulty when a change in the total power consumption between the second and third time periods differs from the second reference rated power consumption by at least the prescribed amount.

8. The refrigerator of claim 7, wherein the plurality of loads include one or more loads having feedback uncontrollable by the microcomputer.

9. The refrigerator of claim 7, wherein the microcomputer diagnoses, as the faulty node, one of the plurality of node having an associated reference power consumption in the load power reference set that corresponds to a difference between the power consumption and the prescribed power reference.

10. A method for diagnosing a fault of a refrigerator, comprising:
detecting a current inputted to the refrigerator
determining a power consumption of the refrigerator base on the current;
comparing the power consumption with a prescribed power reference; and
diagnosing a fault occurring in one or more of a plurality of loads included in the refrigerator based on comparing the power consumption with the prescribed power reference,
wherein the current inputted to the refrigerator is total current of the refrigerator,
wherein the diagnosing the fault includes:
   identifying a faulty load among the plurality of loads based on a load power reference set when a difference between the power consumption and the power reference exceeds a threshold error range,
wherein the load power reference set identifies reference power consumptions for the plurality of loads, and
wherein diagnosing the faulty load among the plurality of loads includes:
   stopping the plurality of loads during a first time period,
   sequentially reactivating the plurality of loads after stopping the plurality of loads, sequentially reactivating the plurality of loads including activating a first load, of the plurality of loads, during a second time period after the first time period, and activating both the first load and a second load, of the plurality of loads, during a third time period after the second time period,
   measuring the total power consumption as the plurality of loads are sequentially reactivated,
   comparing the total power consumption with the load power reference set, the load power reference set including a first reference rated power consumption associated with the first load, and a second reference rated power consumption associated with the second load, and diagnosing the faulty load among the plurality of loads based on comparing the measured power consumptions with the load power reference set, the first load being diagnosed as faulty when a change in the total power consumption between the first and second time periods differs from the first reference rated power consumption by at least a prescribed amount, and the second load being diagnosed as faulty when a change in the total power consumption between the second and third time periods differs from the second reference rated power consumption by at least the prescribed amount.

11. The method of claim 10, wherein identifying the faulty load among the plurality of loads includes identifying, as the faulty load, one of the plurality of loads having a reference power consumption in the load power reference set that corresponds to a difference between the power consumption and the power reference.

* * * * *